(12) United States Patent
Bauer et al.

(10) Patent No.: US 7,230,309 B2
(45) Date of Patent: Jun. 12, 2007

(54) SEMICONDUCTOR COMPONENT AND SENSOR COMPONENT FOR DATA TRANSMISSION DEVICES

(75) Inventors: Michael Bauer, Nittendorf (DE); Thomas Engling, Königsbronn (DE); Alfred Haimerl, Sinzing (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 203 days.

(21) Appl. No.: 10/956,087

(22) Filed: Oct. 4, 2004

(65) Prior Publication Data

US 2005/0104149 A1    May 19, 2005

(30) Foreign Application Priority Data

Oct. 2, 2003    (DE) ................................ 103 46 474

(51) Int. Cl.
*H01L 31/0203* (2006.01)
(52) U.S. Cl. ...................................... 257/433; 257/434
(58) Field of Classification Search ................ 257/433, 257/431, 432, 434
See application file for complete search history.

(56) References Cited

U.S. PATENT DOCUMENTS

| | | | |
|---|---|---|---|
| 4,236,086 A | 11/1980 | Hoebel | |
| 4,960,983 A | 10/1990 | Inoue | |
| 4,972,089 A | 11/1990 | Stevenson | |
| 5,196,682 A | 3/1993 | Englehardt | |
| 6,217,744 B1 | 4/2001 | Crosby | |
| 6,724,290 B1 * | 4/2004 | Ohnmacht et al. | .......... 336/200 |

FOREIGN PATENT DOCUMENTS

| | | |
|---|---|---|
| DE | 27 52 783 | 10/1979 |
| DE | 3824870 A1 | 4/1989 |
| DE | 197 05 301 C1 | 10/1998 |
| DE | 199 24 603 A1 | 11/2000 |
| DE | 10132385 A1 | 1/2003 |
| WO | WO 91/13339 A1 | 9/1991 |
| WO | WO 99/08498 A1 | 7/1998 |
| WO | WO 98/36507 A1 | 8/1998 |

* cited by examiner

*Primary Examiner*—Roy Potter
(74) *Attorney, Agent, or Firm*—Edell, Shapiro & Finnan, LLC (57) ABSTRACT

The invention relates to a semiconductor component and a sensor component with data transmission devices, for wireless transmission the semiconductor component having a main coupling element and the sensor component having a sensor coupling element. The invention affords the possibility of multiple sensor applications without direct electrical contact between sensor component and semiconductor component, which may have a logic chip.

10 Claims, 6 Drawing Sheets

SEMICONDUCTOR COMPONENT AND SENSOR COMPONENT FOR DATA TRANSMISSION DEVICES

CROSS REFERENCE TO RELATED APPLICATIONS

This application claims priority under 35 USC §119 to German Application No. DE 103 46 474.3, filed on Oct. 2, 2003, and titled "Semiconductor Component and Sensor Component for Data Transmission Devices," the entire contents of which are hereby incorporated by reference.

BACKGROUND OF THE INVENTION

1. Field of the Invention

The present invention relates generally to components for wireless, data transmission devices and, more particularly to a semiconductor component employing a main coupling element and a sensor component employing a sensor coupling element.

2. Description of the Related Art

Systems such as transponder units and smart card systems typically include at least two components: a station and a response circuit, which interact wirelessly to form a data transmission circuit. The station employs a primary coil and a signal generator for generating an alternating magnetic field with a carrier frequency. The station further includes an amplitude demodulator. The response circuit (e.g., disposed within a smart card) includes a secondary coil and an amplitude modulator for influencing the load of the secondary coil. The amplitude modulator is designed such that the alternating magnetic field can be modulated with a data signal, which can be demodulated by the station.

Transponder units and smart cards are not typically disposable items that are discarded or destroyed after a single use or a few uses. Given the high number of uses over the lifetime of such data transmission devices, the production costs can be relatively high without significantly impacting the cost per use of these devices. However, it would be desirable to use data transmission devices in disposable products, such as sensor components for medical use, and to achieve a production cost range that permits even a single use of the sensor component to be economically tenable. For example, it would be desirable to provide a data transmission device with a semiconductor component and a sensor component wherein, for hygienic reasons, the sensor component is disposable (e.g., destroyed after a single use).

SUMMARY OF THE INVENTION

The present invention provides a semiconductor component and a sensor component for data transmission devices, wherein, for hygienic reasons, the sensor component is disposable, i.e., designed to be destroyed after a single use.

In accordance with one aspect of the present invention, a semiconductor component includes a semiconductor chip arranged on a substrate, the substrate and the semiconductor chip being at least partly covered by a plastic housing composition. A main coupling element for wireless transmission is arranged in the region of the plastic housing composition. The main coupling element is electrically connected to an integrated circuit arranged on the active top side of the semiconductor chip. External contacts of the semiconductor component are electrically connected to the integrated circuit with the main coupling element.

A semiconductor component of this type has the advantage that electrical signals can be emitted via the main coupling element for wireless transmission in a manner excited by the integrated circuit. Even a limited energy transmission is possible via the main coupling element. The main coupling element also serves, in a wireless manner by means of electromagnetic waves, for receiving a carrier frequency modulated with signals and for demodulating the modulated carrier frequency with the aid of the integrated circuit and for assigning the received signals, for storing the received signals in corresponding registers and for evaluating the received signals, and also for outputting the received signals via the external contacts of the semiconductor component for further processing. The semiconductor component thus constitutes a receiving and transmitting station, and also an evaluation and storage unit. The integrated circuit required for these operations may be distributed among a plurality of semiconductor chips, so that the semiconductor component with substrate and coupling element constitutes a transmitting and receiving module.

During operation, the semiconductor component generates a periodic signal at the main coupling element with a built-in signal generator for the data transmission. The main coupling element thereupon forms an alternating electromagnetic field that acts as a "near field" in the local region of the main coupling element. Depending on the design of the main coupling element, either a capacitive effect or an inductive effect of the main coupling element will be predominant in the near field. The capacitive effect predominates in the near field in the case where the main coupling element is of sheet-like design, while the inductive effect predominates in the near field in the case where the main coupling element is of coil-type design.

A sensor component having a sensor coupling element may be introduced into the region of the near field, the geometrical design of the sensor coupling element depending on the geometrical form of the main coupling element. In the case where the main coupling element is of a sheet-like design, the sensor coupling element forms a capacitive counter-electrode with respect to the area of the main coupling element. In the case where the main coupling element is of coil-type design, the main coupling element acts as a primary coil in the local region, so that the sensor coupling element is likewise designed in coil-type fashion as a secondary coil.

With the aid of the coupling elements, the sensor component can be supplied with energy by means of a carrier frequency, while data signals can simultaneously be exchanged in between the semiconductor component and the sensor component by modulation of the carrier frequency. A further advantage of the semiconductor component is that the main coupling element is embedded in the plastic housing composition of the semiconductor component. The plastic housing composition has an insulating effect and has a dielectric constant that can increase the efficiency in the near-field range, particularly in the case of capacitive coupling. Furthermore, the embedding of the main coupling part in the plastic housing composition stabilizes both the position of the main coupling element and its coupling to the integrated circuit on the active top side of the semiconductor chip. Consequently, the embedding of the main coupling element in the housing composition of the semiconductor component provides both electrical and mechanical advantages in addition to the associated protection of the main coupling element against erosive and corrosive and also mechanical damage caused by the operating environment.

The main coupling element may have a main coupling coil. Although it is more complex to embed a main coupling coil in a plastic housing composition than a main coupling plate or main coupling area, a main coupling coil nonetheless has the advantage that the inductive component predominates in the near field and the calculation principles for transformers can thus be used for determining the dimensions of the main coupling element.

Further, the active top side of the semiconductor chip of the semiconductor component may have an optically sensitive region arranged below an optically transparent opening in the plastic housing composition. In this embodiment of the invention, the possibility of receiving and electronically evaluating optical signals is advantageously afforded in addition to the transmission channel via the main coupling element. To enable optical signals to reach the active top side of the semiconductor chip, the plastic housing composition includes the optically transparent opening according to the invention.

The optically transparent opening furthermore has the advantage that the optical transmission is, to a large extent, not disturbed by scattered light, especially since the surrounding plastic housing composition of the optically transparent opening constitutes an optical aperture. The optically sensitive region in the bottom region of the optically transparent opening may be formed on the semiconductor chip as a photodiode or phototransistor adjoined by an integrated evaluation circuit for the optical signals. Such an optically sensitive region in the semiconductor component furthermore has the advantage that samples that are to be examined by chromatography and are applied to the sensor component can be evaluated directly through the optically sensitive region of the semiconductor component.

It is further provided that the main coupling element surrounds the optically transparent opening in the plastic housing composition. What is achieved with this embodiment is that the optically transparent opening is arranged relatively centrally in the plastic housing composition, and the effect as an optical aperture is thus improved. For this purpose, the optically transparent opening may have an optically transparent gel that protects the optically sensitive region of the active top side of the semiconductor chip against damage. Furthermore, focusing elements such as lenses may cover the optically transparent opening and amplify the signal effect.

Furthermore, it is provided that the substrate can be a rewiring substrate, which has external contacts of the semiconductor component on its underside. The top side of the rewiring substrate is covered partly by the semiconductor chip and partly by the plastic housing composition. In the region of the top side of the rewiring substrate which is covered by the plastic housing composition, bonding contact pads may be arranged all around the semiconductor chip. The bonding contact pads are connected to the external contacts of the semiconductor component via rewiring lines on the top side of the rewiring substrate and via through contacts to external contact areas on the underside of the rewiring substrate.

The bonding contact pads on the top side of the rewiring substrate are connected via bonding wires to corresponding contact areas on the active top side of the semiconductor chip. Consequently, the external contacts of the semiconductor component have an electrical connection to the contact areas of the semiconductor chip and thus to the electrodes of the integrated circuit. This arrangement has the advantage that, via external contacts, both control signals and supply signals can be fed to the semi-conductor chip with the main coupling element of the semiconductor component.

Relative to the semiconductor component, a sensor component can be constructed with a lower outlay and fewer components. The sensor component with its sensor coupling element embedded in a plastic housing composition does not require a rewiring substrate with external contacts, since both the supply of energy and the data transmission are effected via the sensor coupling element. External contacts and also a complex rewiring substrate are thus obviated. Rather, a rewiring, if necessary, may be provided directly on the active top side of the sensor chip without increasing the production costs, since it is possible to apply such a rewiring with the last metal structure on the semiconductor chip.

Consequently, the invention encompasses a sensor component having a sensor chip, the sensor chip being partly encapsulated by a plastic housing composition. Arranged in the region of the plastic housing composition is a sensor coupling element for wireless transmission. For this purpose, the sensor coupling element is electrically connected to a sensor region arranged on its active top side. The sensor coupling element enables a wireless energy transmission to the sensor chip and provides a wireless data transmission for the sensor chip.

A sensor component of this type has the advantage that it is constructed from only three main components, namely the plastic housing composition in which merely a sensor coupling element and a sensor chip are embedded. The production costs are thus clear and low, especially as neither a rewiring substrate nor external contacts on the rewiring substrate need to be provided for the sensor component. In principle, the sensor component may be destroyed for hygienic reasons after an analysis of a medical sample and thus after a single use, without incurring substantial cost from the destruction. For bacteriological and virological examinations, the sensor component thus has considerable advantages over other known analysis instruments and analysis units.

Furthermore, the plastic housing composition may have a sensor opening for application of samples to a sensor region of the sensor chip. The sensor chip itself may be produced not only from semiconductor material but also from transparent glass, transparent plastic or transparent ceramic material. These materials may have, in addition to a rewiring coating, a sensitive coating in the sensor region, with the aid of which the electrical resistance of the sample, chromatographic changes in the sample or other parameters of the sample arranged in the sensor opening are detected.

While the sensor opening is provided for direct contact between the sample and the sensor region of the sensor chip, in a further embodiment of the invention the underside of the sensor chip has an optically transmitting region. The optically transmitting region is arranged in a sensor optical system opening in the plastic housing composition on the underside of the sensor chip. The sensor optical system opening is smaller than the sensor region arranged on the top side of the sensor chip and constitutes an optical aperture via which the optical effect of the sample can be transmitted onto the optically sensitive region of a semiconductor component arranged underneath. Consequently, it is possible to cover the sensor region of the sensor chip with a medical or biological material, such as blood. Via the optically transparent sensor chip and the aperture on the underside of the sensor component, chromatographic properties of the sample can be transmitted onto the optically sensitive region of the semiconductor component in order to evaluate the optical signals there. Other parameters such as resistance and/or impedance values may simultaneously be transmitted in wireless manner to the main coupling element via the sensor coupling element.

In a further embodiment of the sensor component, the sensor coupling element embedded in the plastic housing composition surrounds the sensor opening in the plastic housing composition of the sensor component. This advantageously has the effect that the medical sample to be applied is locally delimited by the plastic housing composition and is held in the sensor opening.

A further aspect of the invention relates to a sensor stack including a semiconductor component having a main coupling element in accordance with the above embodiments as a first stack component and a sensor component in accordance with the above embodiments as second stack component, which is stacked on the semiconductor component. The two stack components are connected in wireless manner via their coupling elements. In this case, the main coupling element supplies the sensor chip of the sensor component with energy via the sensor coupling element of the sensor component.

A stack of this type has the advantage that the sensor component with its coupling element comes into the local region of the coupling element of the semiconductor component, thereby enabling a direct, low-loss energy transmission. An efficiency of between 1% and 5% is expected in the case of such a wireless energy transmission, while the pure signal data transmission may proceed independently thereof. Moreover, the sensor chip of a sensor stack with its sensor coupling elements may be made sufficiently small to arrange a plurality of sensor components next to one another on the semiconductor component and above the main coupling element. In this case, the signal transmissions may be carried out in a multiplex operation for each of the sensor components to be tested, while the energy supply proceeds uniformly for all of the sensor components via a corresponding near-field coupling.

In a preferred embodiment of the invention, an adhesive layer, an adhesive gel and/or a double-sided adhesive film is arranged between the sensor component and the semiconductor component. The associated adhesive or gel does not cure, so that the sensor components can be removed again from the semiconductor component without excessive action of force. The adhesive, film and/or gel used are in this case optically transparent in order to enable an optical transmission of data.

In a further embodiment of the invention, the sensor component is positioned by a mechanical device, such as a conveyor belt or a rotary table, above the semiconductor component in such a way that a signal transmission is possible optically or electromagnetically. This embodiment has the advantage that it facilitates automation of analysis, especially since manual removal of the sensor component is obviated. This mechanical device is then configured such that the sensor components and their samples are positioned above the semiconductor component and analyzed either in a stepwise manner or continuously.

A method for testing a biochemical sample with the aid of a sensor component according to the invention and a semiconductor component that supplies the sensor component with energy includes the following steps. Firstly, a biochemical sample is applied to a sensor component. The sensor component with the sample is then placed onto a semiconductor component. The wireless energy transmission from the semiconductor component to the sensor component is subsequently effected. At the same time or with a temporal offset, a wireless signal transmission from the sensor component to the semiconductor component may be effected via the coupling elements of the two components there lying one on the other or stacked one on the other. In addition or as an alternative, it is possible to effect an optical coupling between the sensor region of the sensor component and an optically sensitive region of a semiconductor chip of the semiconductor component that is free of a plastic housing composition.

This method has the advantage that a respective sensor component can be used for different biochemical samples, which sensor component is subsequently destroyed as a disposal product. For this purpose, as mentioned above, the sensor component has merely three components, namely a sensor chip, a coupling element coupled thereto for wireless transmission, and a housing composition that partly embeds the sensor chip and completely embeds the coupling element. Further, the method has the advantage that the placement of the sensor component with a sample onto the semiconductor component can be effected relatively non-critically, since the coupling elements do not have to be exactly opposite one another for the wireless transmission. Rather, it suffices for the sensor component with its coupling element to be brought into the local region of the coupling element of the semiconductor component in order to ensure both the energy transmission and the signal transmission.

An implementation of the method may furthermore have the following steps. Firstly, the semiconductor component calls up sensor data from the sensor component via its main coupling element, whereupon the sensor component supplies, via the sensor coupling element, sensor results to the semiconductor component via the main coupling element thereof for evaluation and storage. This method has the advantage that the mode of operation of sensor component and semiconductor component depends only on the coupling effect of the two coupling elements. An optical transmission is not provided in this implementation of the method.

A further implementation of the method provides for the semiconductor component to call up sensor data via the main coupling element and for the sensor component thereupon to supply sensor results optically to the semiconductor component for evaluation and storage. In this exemplary implementation of the method, a transmission of the signals is carried out only in one direction, namely from the semiconductor component via the main coupling element to the sensor coupling element, but not in the opposite direction from the sensor coupling element to the main coupling element. Rather, the second possibility of the sensor stack, in the case of which the optical transmission path is used, is utilized. This optical transmission path from the sensor component to the semiconductor component has the advantage that the optical transmission path is insensitive to electromagnetic interference fields.

Furthermore, provision is made for arranging and testing a plurality of biochemical samples simultaneously on a semiconductor component. Given a design with a sufficiently large area, a plurality of sensor components with smaller coupling elements than the main coupling element may be arranged in the region of the coupling element of the semiconductor component. This has the advantage that mass examinations become possible in a cost-effective manner.

Furthermore, the method according to the invention provides for measurement results and/or evaluation results to be forwarded from the integrated circuit of the semiconductor component to a superordinate circuit via external contacts of the semiconductor component. This concept makes it possible for a plurality of semiconductor components to be arranged on the superordinate circuit board, so that the throughput of measurements of biochemical samples can be increased further. It is possible to populate entire trays with semiconductor components, with the semiconductor components having a plurality of sensor components stacked thereon one next to the other.

The invention affords the possibility of multiple sensor applications without direct electrical contact between sensor component and semiconductor component, which may have a logic chip. A further advantage is the single application in multiple biological tests by means of the semiconductor sensors. Finally, the invention provides the advantage of avoiding electrical connections for the sensor stack, so that, merely after each sample detection and sample measurement, only the sensor component has to be discarded after simply being removed, pushed down or sucked away from the semiconductor component.

Advantageously, the electrical connection is not produced by fixed wire connections or soldering contact connections, but rather by transmission of the sensor signal at a defined frequency by, for example, an inductive pulse that is transmitted via a coil. In a specific embodiment of the invention, the signal transmission per se may be effected by an optical pulse from the sensor chip via an optically transmissive substance onto a corresponding optically sensitive region of the logic chip of the semiconductor component or by means of piezotechnology through a change in pressure at the logic chip of the semiconductor component.

Moreover, the invention has the advantage that, by integrating a capacitor unit on the sensor chip, the latter can be charged for an optical or electrical pulse by the coupling element in the form of an induction coil. As a result, plural applications of the sensors can be achieved without the direct electrical supply thereof.

If fixing becomes necessary during the production of a sensor stack, the sensor component can be implemented on the semiconductor component by an optically transmissive double-sided adhesive film using a paste or a corresponding gel. By shifting the sensor component on the semiconductor component, the corresponding coupling position can be shifted using a gel layer. If the sensor component is connected to the semiconductor component to form a sensor stack by such layers comprising paste, gel or comprising a double-sided adhesive film, then the sensor components can be exchanged by pulling the used sensor components off the respective adhesive layer and a new sensor component can be fixed by lightly pressing it onto the adhesive layer again. Such a rapid change cannot be effected in the case where the sensor component is fixedly electrically connected to the semiconductor component.

The above and still further features of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
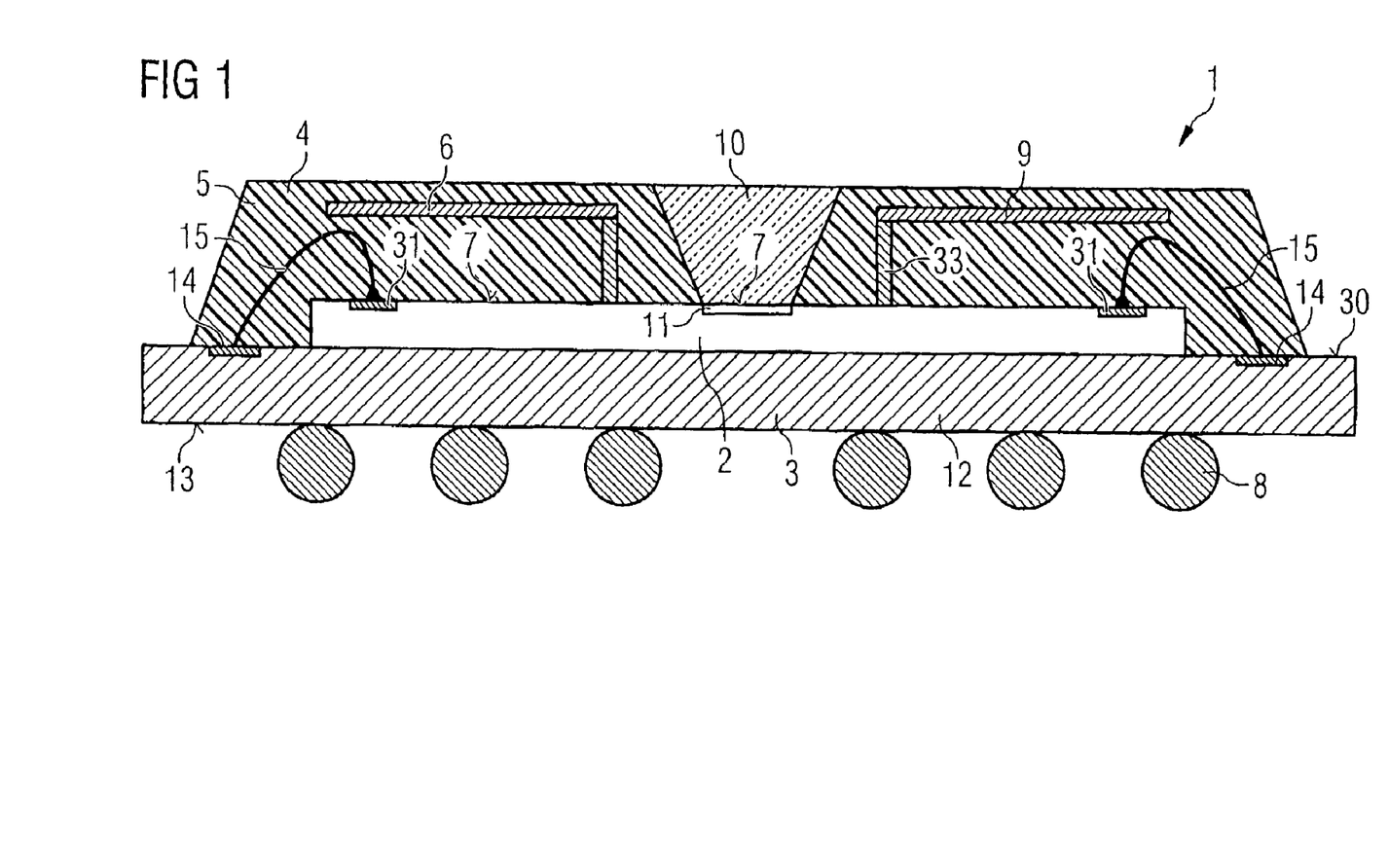
FIG. 1 shows a diagrammatic cross section through a semiconductor component with a semiconductor chip, in accordance with an embodiment of the present invention.

FIG. 1 shows a diagrammatic cross section through a semiconductor component 1 with a semiconductor chip 2, in accordance with an embodiment of the present invention. The semiconductor component 1 has a substrate 3 with a rewiring structure. On its underside 13, the substrate 3 has external contacts 8, which are connected via through contacts through the substrate 3 to rewiring lines on a top side 30 of the rewiring substrate 12. The rewiring lines (not shown in FIG. 1) lead to bonding contact pads 14 that are arranged on the top side of the rewiring substrate 12.

By virtue of this arrangement of external contacts 8 with through contacts and rewiring lines, and also with bonding contact pads 14, the entire underside 13 of the rewiring substrate 12 can be utilized for the fitting of external contacts 8, even though the semiconductor chip 2 is arranged on the top side 30 of the rewiring substrate 12. The semiconductor chip 2 carries an integrated circuit with logic functions on its active top side 7 and has an optically sensitive region 11 in the center of the active top side 7. The optically sensitive region is kept free of a plastic housing composition 4.

In the plastic housing composition 4, a main coupling element 6 is arranged around the optically sensitive region 11. The main coupling element may have, in this embodiment of the present invention, a main coupling coil 9 arranged in turns around the optically sensitive region 11. The main coupling coil 9 is connected via contact pins 33 to the integrated circuit on the active top side 7 of the semiconductor chip 2.

Furthermore, the active top side 7 of the semiconductor chip 2 has contact areas 31, which are electrically connected via bonding wires 15 to the bonding contact pads 14 of the rewiring substrate 12. Consequently, bonding wires 15, semiconductor chip 2, contact pins 33 and the main coupling coil 9 are embedded in the plastic housing composition 4. Accordingly, in this embodiment, only the top side 30 of the rewiring substrate 12 is covered by plastic housing composition, while the underside 13 has the external contacts 8 and is not covered by plastic housing composition.

An optically transparent opening 10 is arranged above the optically sensitive region 11 of the active top side 7 of the semiconductor chip 2. The opening is covered with an optically transparent material such as an acrylic resin or with an optically transparent gel, so that the optically sensitive region 11 on the active top side 7 of the semiconductor chip 2 is protected against damage and contamination. A principally inductive near field is established by the main coupling coil 9 when a high-frequency supply voltage is applied to one of the external contacts 8. Using this near field, energy can be transmitted from the main coupling coil 9 and/or at the same time signals can also be transmitted and received in this way.

Measurement signals can likewise be coupled into the semiconductor component optically via the optically transparent region. Moreover, the region 5 of the plastic housing composition 4 has the optically transparent opening 10.

Figure 2:
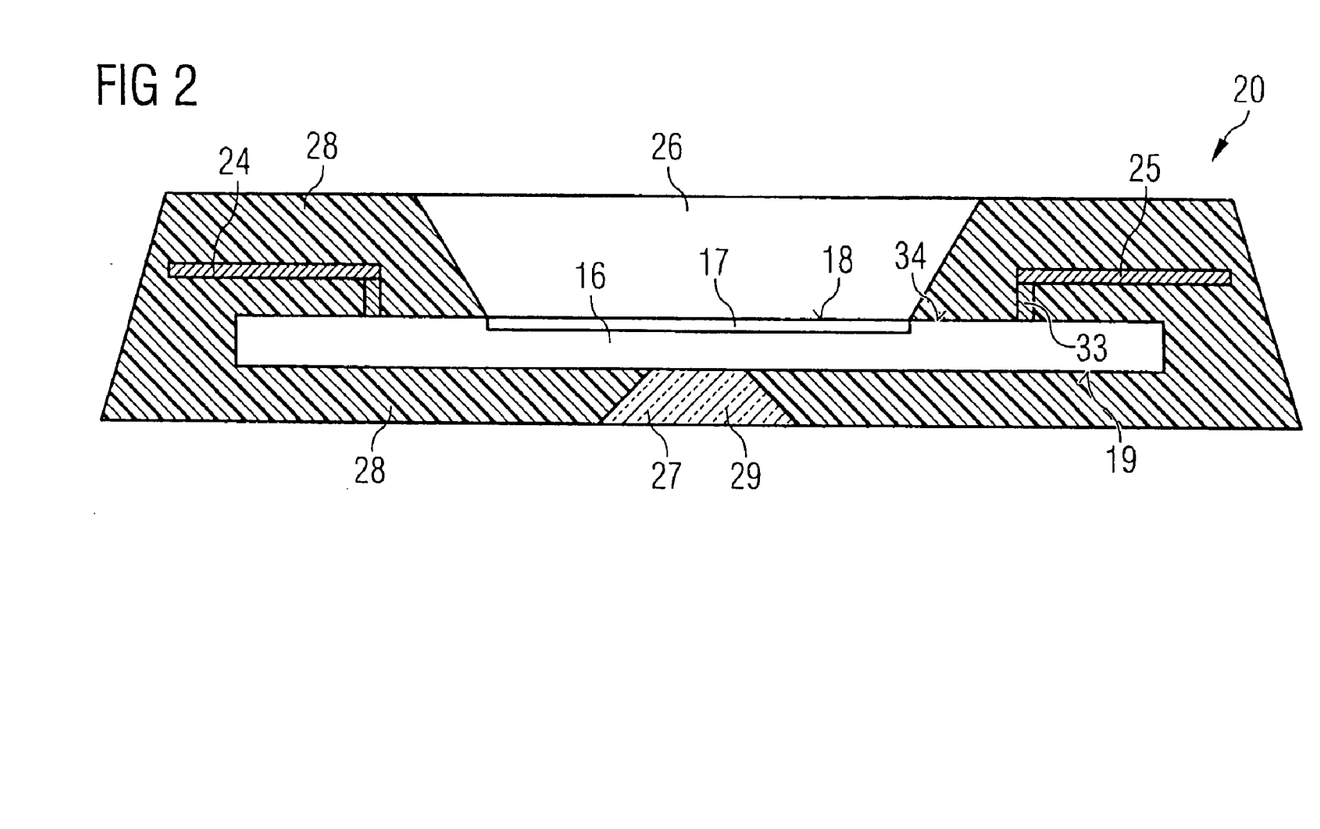
FIG. 2 shows a diagrammatic cross section through a sensor component with a sensor chip in accordance with an additional embodiment of the present invention.

FIG. 2 shows a diagrammatic cross section through a sensor component 20 with a sensor chip 16, which is partially embedded in a plastic housing composition 28, with a sensor opening 26 being left free on the top side 18 of the sensor chip. The sensor opening 26 forms a trough in the plastic housing composition 28 for receiving a biochemical sample to be measured. A sensor coupling element 24 in the form of a sensor coupling coil 25 is arranged in the edge region 34 of the sensor chip 16. The sensor coupling coil 25 is electrically connected via contact pins 33 to the active top side 18 of the sensor chip 16.

The plastic housing composition 28 surrounds the edge region of the sensor chip 16 and also covers parts of the underside 19 of the sensor chip 16 with a sensor optical system opening 27 being left free, which is filled with an optically transmitting region 29. Via opening 27, optical signals can be sent directly to the semiconductor component bypassing the sensor coupling coil 25. For this purpose, the sensor chip 16 may be composed of a coated glass which, on its top side, may have a sample to be examined by chromatography. Additionally, with the aid of the sensor opening 26 and the sensor region 17, one can measure the resistance and/or the impedance of the sample as a further parameter and transmit the latter to the semiconductor component via the coupling elements 6 and 24.

Figure 3:
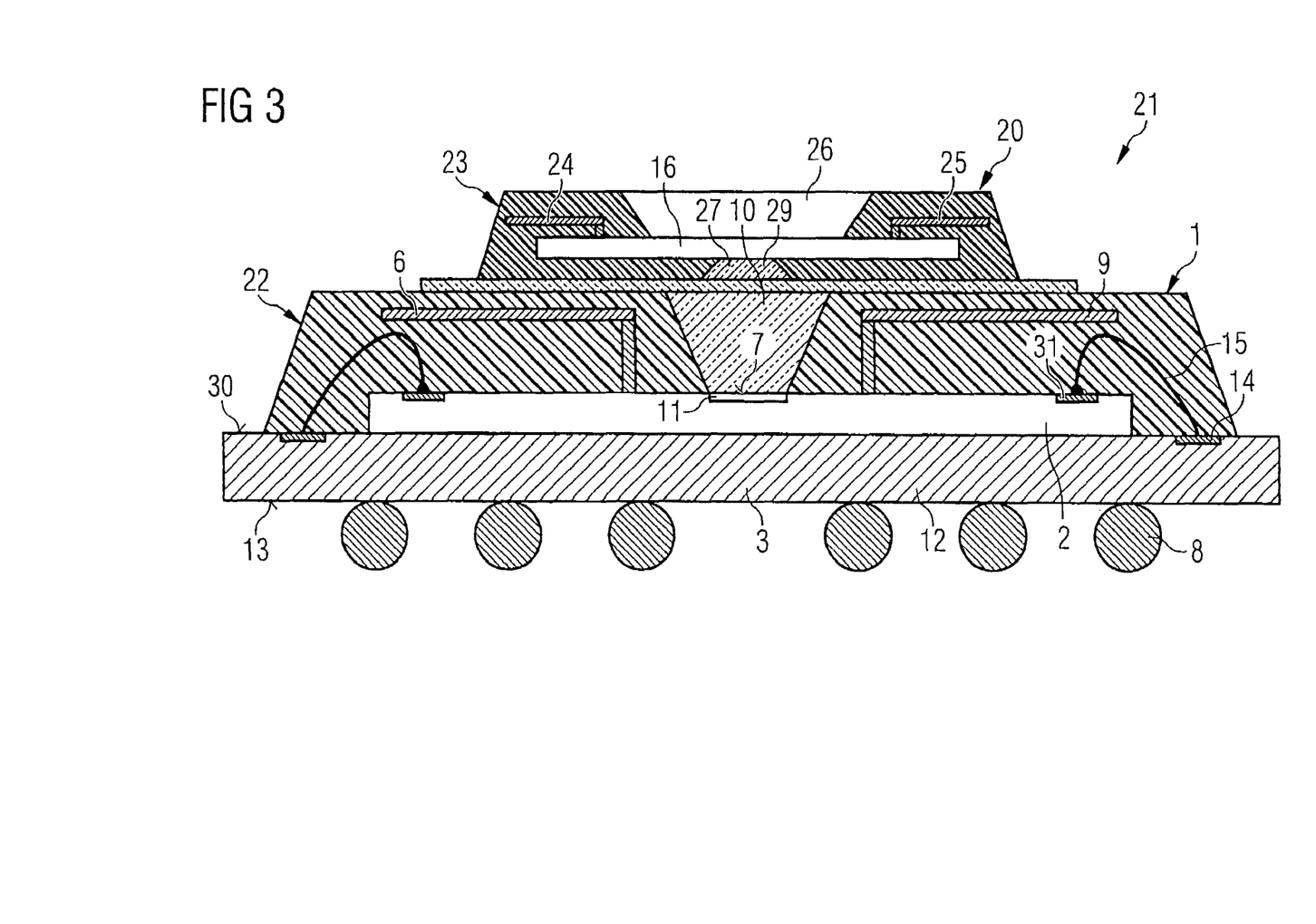
FIG. 3 shows a diagrammatic cross section through a sensor stack with a semiconductor component and a sensor component, in accordance with another embodiment of the present invention.

FIG. 3 shows a diagrammatic cross section through a sensor stack with a first, lower stack component 22 and with a second, upper stack component 23. Components having functions identical to those in the previous figures are identified by identical reference symbols and are not discussed separately.

The sensor component 20 has the components that are described in connection with FIG. 2 and is arranged as second stack component 23 on the semiconductor component 1, as shown in FIG. 1. A double-sided adhesive film 32 is arranged between the semiconductor component 1 and the sensor component 20 and fixes the sensor component 20 on the semiconductor component 1 for the time of the measurement period. After a measurement has been taken, a new sensor component can be applied to the double-sided adhesive film 32, by pushing down the semiconductor component 1, via applying pressure on sensor component 20.

In this embodiment of the present invention, the coupling of the data transmission from the sensor chip 16 to the semiconductor chip 2 is accomplished via the optically transmitting opening 27 in the sensor chip 16 and the optically transparent opening 10 in the semiconductor component 1. Accordingly, the double-sided adhesive film 32 is optically transparent in order to fix the sensor component on the semiconductor component. In this embodiment of the present invention, the signal transmission from the semiconductor component 1 to the sensor component 20 is effected by means of an inductive signal that is transmitted inductively from the main coupling coil 9 to the sensor coupling coil 25. In principle, the main coupling coil 9 forms a primary winding relative to the sensor coupling coil, which constitutes a secondary winding of a transformer. However, the efficiency for the energy transmission is low due to the large distance between the two coils. The efficiency lies in the range on the order of 1% to 5% of the energy fed to the main coupling coil 9.

Figure 4:
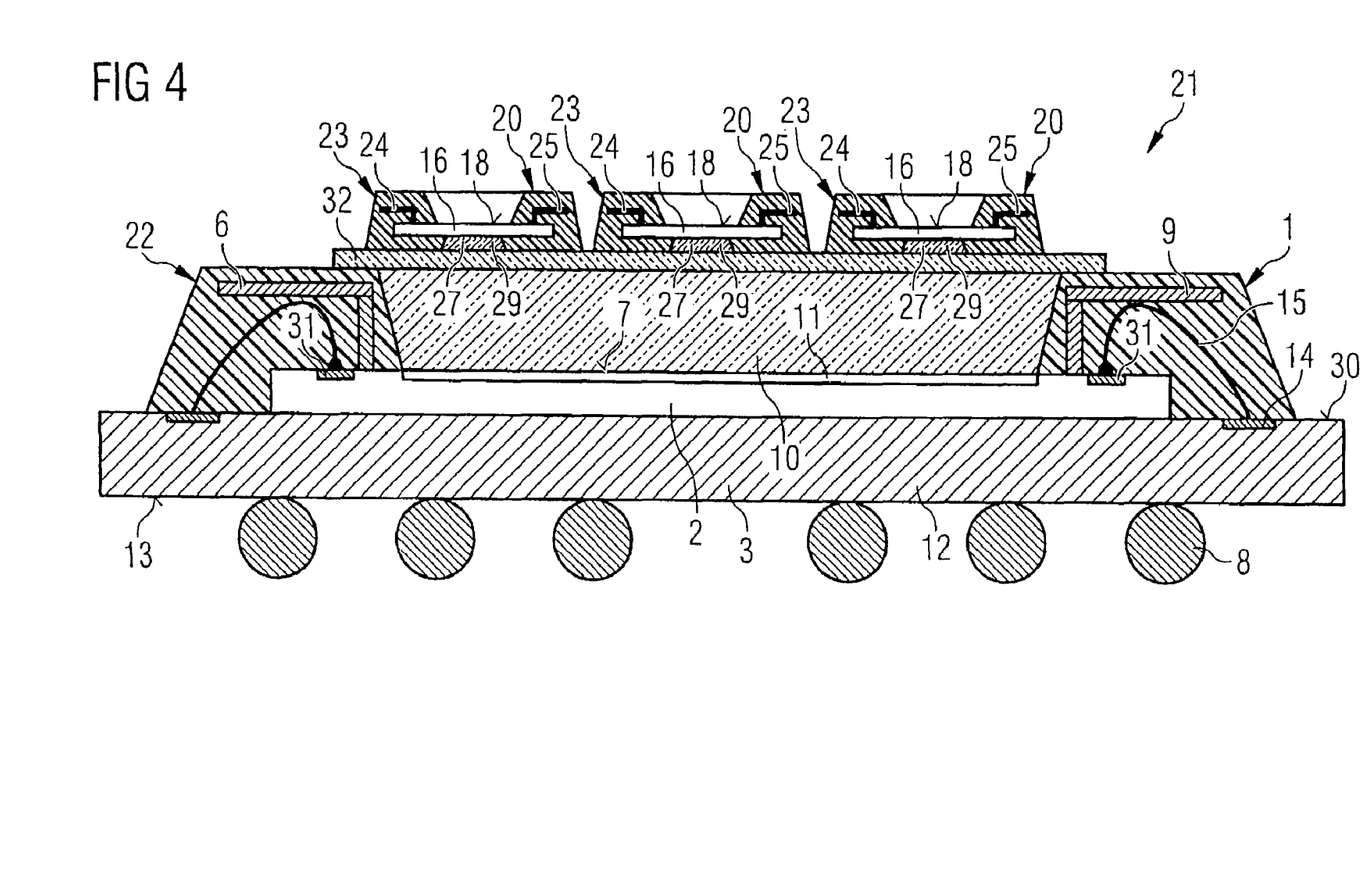
FIG. 4 shows a diagrammatic cross section through a sensor stack with a semiconductor component and a plurality of sensor components in accordance with present embodiment of the invention.

Turning now to FIG. 4, there is shown a diagrammatic cross section through a sensor stack 21 with a semiconductor component 1 and a plurality of sensor components 20, in accordance with an embodiment of the present invention. Components having functions identical to those in previous figures are identified by identical reference symbols and are not discussed separately.

The optically transparent opening 10 in the center of the semiconductor chip 2 and the optically sensitive region 11 of the active top side 7 of the semiconductor chip 2 are significantly larger than in the embodiments described above. Due to the enlargement of this optically transparent region of the semiconductor component 1, a plurality of these components can be fixed on the semiconductor component 1 and measured.

In this case, the fixing of the sensor components 20 is achieved by a double-sided adhesive film 32. Each of the sensor components 20 can be driven by the main coupling coil 9, and measurement parameters and/or measurement results of each sensor component can be called up successively and/or simultaneously as well. Via the external contacts 8 of the semiconductor component 1, these measurement values can be transmitted to a superordinate circuit with an evaluation and a memory. In this embodiment of the present invention, the sensor components 20 are fixed on the semiconductor component 1 during the measurement by means of a double-sided adhesive film 32.

Consequently, it is possible to feed the measurement results to an evaluation and storage device via an optical coupling between sensor component 20 and semiconductor component 1. However, the initiation and control signals are transmitted from the semiconductor component, 1 via the main coupling element 9, to the sensor coupling elements 24 in order to control the beginning and the end of a measurement.

Figure 5:
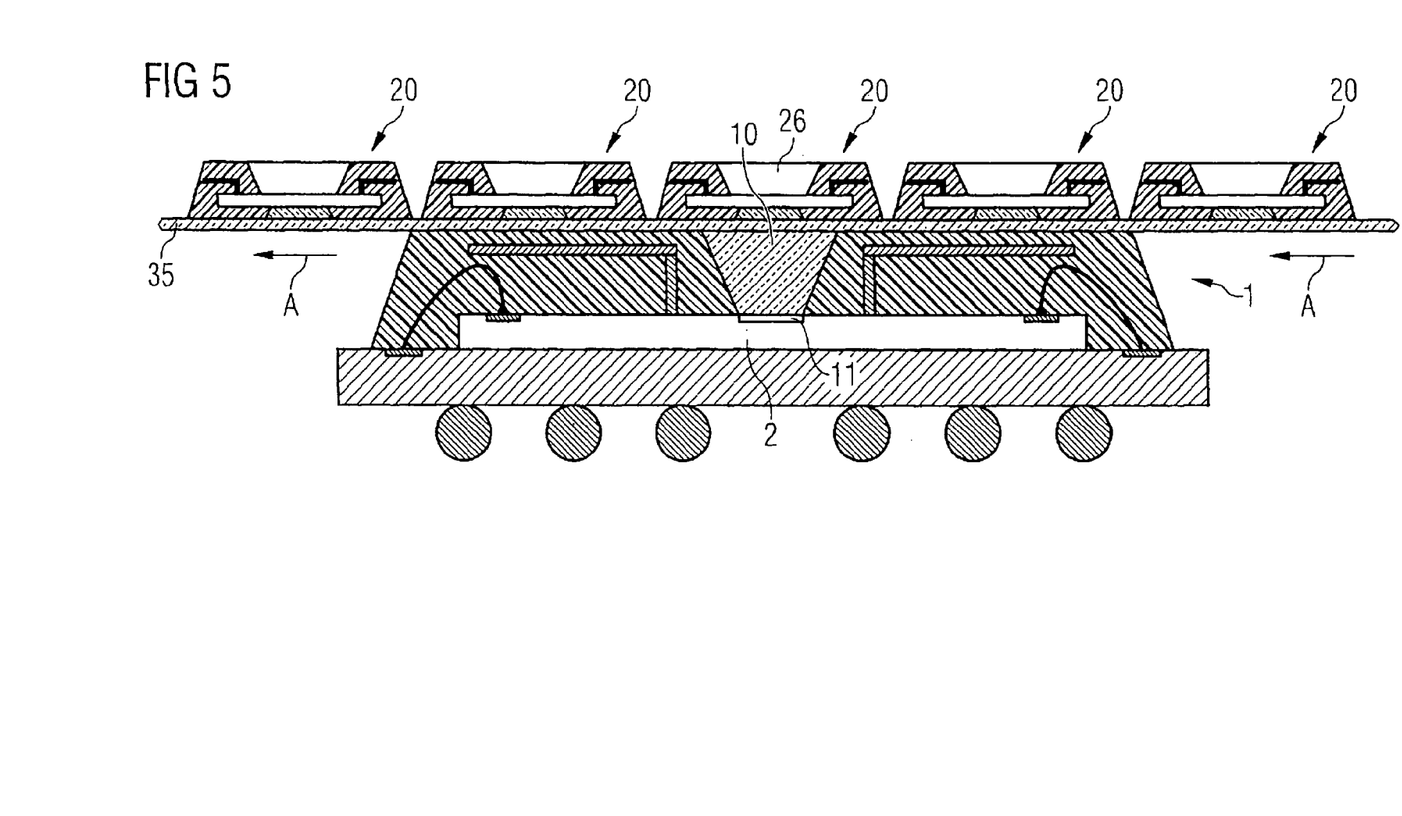
FIG. 5 shows a diagrammatic cross section through an arrangement of sensor components and semiconductor component with conveyor belt in accordance with an embodiment of the present invention.

FIG. 5 shows a diagrammatic cross section through an arrangement of sensor components 20 and semiconductor component 1 with conveyor belt 35. Components having functions identical to those in the previous figures are identified by identical reference symbols and are not discussed separately.

The conveyor belt 35 is optically transmissive so that an optical coupling between a sensor component 20 and the optically sensitive region 11 of the semiconductor chip 2 of the semiconductor component 1 is possible. The optically transmissive conveyor belt 35 is moved stepwise over the optically sensitive region 11 of the semiconductor component 1 for analysis of the sample introduced in the sensor opening 26. After detection of the analysis values, the optically transmissive conveyor belt 35 is conveyed further by one sensor component position, so that an automatic detection of analysis values is possible.

Figure 6:
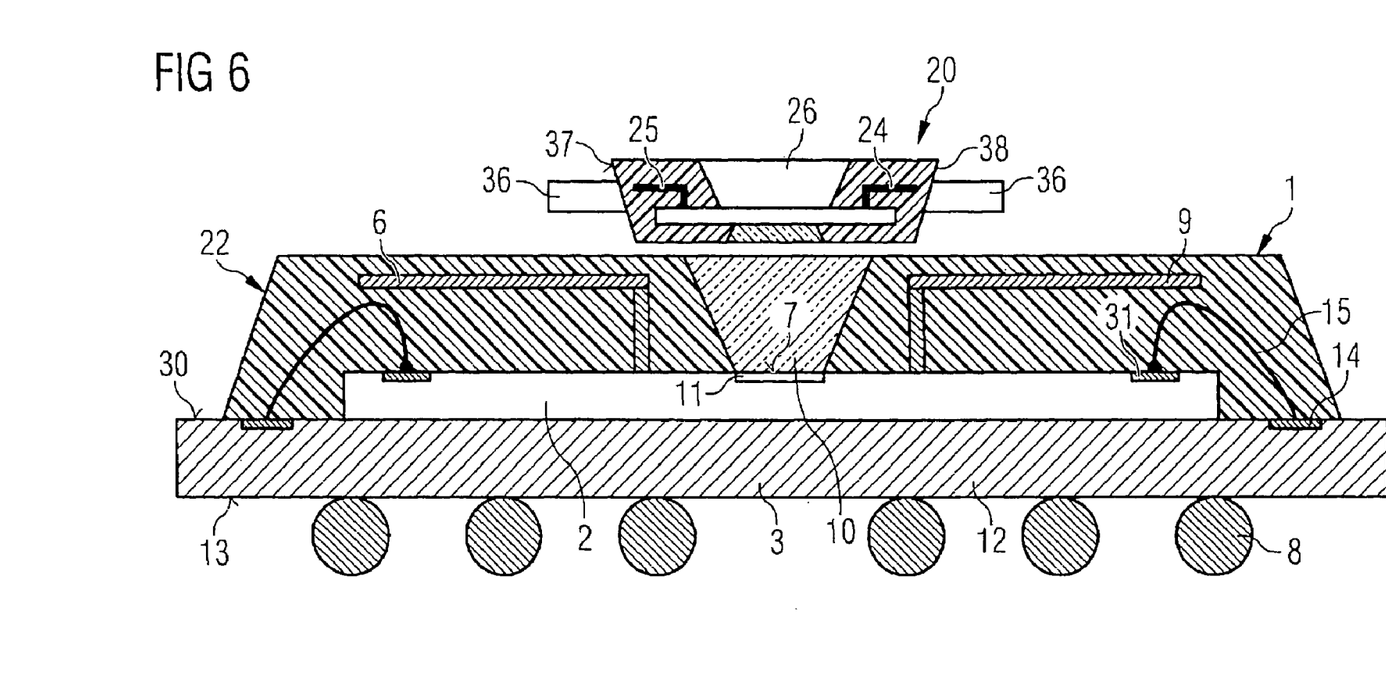
FIG. 6 shows a diagrammatic cross section through an arrangement of a sensor component and a semiconductor component with a gripping arm for the positioning of the sensor component in accordance with an embodiment of the present invention.

FIG. 6 shows a diagrammatic cross section through an arrangement of sensor component 20 and semiconductor component 1 with a gripping arm 36 for the positioning of the sensor component 20. Components having functions identical to those in the previous figures are identified by identical reference symbols and are not discussed separately.

With the aid of the gripping arm 36, the sensor component 20 can be positioned exactly above the optically sensitive region 11 of the semiconductor chip 2 of the semiconductor component 1. The gripping arm 36 is part of an apparatus such as a rotary table, for example, which automatically takes hold of the sensor components 20 for analysis and brings them in each case into the measurement position shown in FIG. 6. For this purpose, the external contour 37 of the sensor component 20 may be adapted to the gripping arm 36, which has an opening 38 in which the sensor component can be placed. By means of a rotary movement of the rotary table (not visible in FIG. 6) to which the gripping arm is fixed, the sensor components 20 inserted in the rotary table and in the openings 38 of the gripping arms are fed stepwise one after the other to the analysis position. Such an arrangement makes it possible to dispense with an optically transmissive transparent carrier in the form of a conveyor belt or in the form of a double-sided adhesive film.

The semiconductor component of the invention provides the advantage that electrical signals can be emitted via the main coupling element for wireless transmission in a manner excited by the integrated circuit. Limited energy transmission may be possible via the main coupling element. In a wireless environment, via electromagnetic waves, the main coupling element can also receive a carrier frequency modulated with signals and demodulate the received signal with the aid of the integrated circuit. Additionally, received signals can be assigned and stored in corresponding registers, evaluated, and transmitted via the external contacts of the semiconductor component for further processing. The semiconductor component can thus constitute a receiving and transmitting station, and also an evaluation and storage unit. The integrated circuit required for this may be distributed among a plurality of semiconductor chips, so that the semiconductor component (e.g., with substrate) and coupling element constitutes a transmitting and receiving module.

During operation, the semiconductor component generates a periodic signal at the main coupling element with a built-in signal generator for the data transmission. The main coupling element thereupon forms an alternating electromagnetic field that acts as a "near field" in the local region of the main coupling element. Depending on the design of the main coupling element, either a capacitive effect or an inductive effect of the main coupling element will be predominant in the near field. The capacitive effect predominates in the near field in the case where the main coupling element is of sheet-like design, while the inductive effect predominates in the near field in the case where the main coupling element is of coil-type design.

A sensor component having a sensor coupling element may be introduced into the region of the near field, the geometrical design of the sensor coupling element depending on the geometrical form of the main coupling element. In the case where the main coupling element is of a sheet-like design, the sensor coupling element forms a capacitive counter-electrode with respect to the area of the main coupling element. In the case where the main coupling element is of coil-type design, the main coupling element acts as a primary coil in the local region, so that the sensor coupling element is likewise designed in coil-type fashion as a secondary coil.

With the aid of the coupling elements, the sensor component can be supplied with energy by means of a carrier frequency, while data signals can simultaneously be exchanged in between the semiconductor component and the sensor component by modulation of the carrier frequency. A further advantage of the semiconductor component is that the main coupling element is embedded in the plastic housing composition of the semiconductor component. The plastic housing composition has an insulating effect and has a dielectric constant that can increase the efficiency in the near-field range, particularly in the case of capacitive coupling. Furthermore, the embedding of the main coupling part in the plastic housing composition stabilizes both the position of the main coupling element and its coupling to the integrated circuit on the active top side of the semiconductor chip. Consequently, the embedding of the main coupling element in the housing composition of the semiconductor component provides both electrical and mechanical advantages in addition to the associated protection of the main coupling element against erosive and corrosive and also mechanical damage caused by the operating environment.

The main coupling element may comprise a main coupling coil. Although it is more complex to embed a main coupling coil in a plastic housing composition than a main coupling plate or main coupling area, a main coupling coil nonetheless has the advantage that the inductive component predominates in the near field and the calculation principles for transformers can thus be used for determining the dimensions of the main coupling element.

Further, the optically sensitive region of the active top side of the semiconductor chip of the semiconductor component advantageously affords the possibility of receiving and electronically evaluating optical signals in addition to the transmission channel via the main coupling element. The optically transparent opening furthermore has the advantage that the optical transmission is, to a large extent, not disturbed by scattered light, especially since the surrounding plastic housing composition of the optically transparent opening constitutes an optical aperture. The optically sensitive region in the bottom region of the optically transparent opening may be formed on the semiconductor chip as a photodiode or phototransistor adjoined by an integrated evaluation circuit for the optical signals. Such an optically sensitive region in the semiconductor component furthermore has the advantage that samples that are to be examined by chromatography and are applied to the sensor component can be evaluated directly through the optically sensitive region of the semiconductor component.

Where the main coupling element surrounds the optically transparent opening in the plastic housing composition, the optically transparent opening is arranged relatively centrally in the plastic housing composition, and the effect as an optical aperture is thus improved. For this purpose, the optically transparent opening may have an optically transparent gel that protects the optically sensitive region of the active top side of the semiconductor chip against damage. Furthermore, focusing elements such as lenses may cover the optically transparent opening and amplify the signal effect.

The substrate can be a rewiring substrate, which has external contacts of the semiconductor component on its underside. The top side of the rewiring substrate is covered partly by the semiconductor chip and partly by the plastic housing composition. In the region of the top side of the rewiring substrate which is covered by the plastic housing composition, bonding contact pads may be arranged all around the semiconductor chip. The bonding contact pads are connected to the external contacts of the semiconductor component via rewiring lines on the top side of the rewiring substrate and via through contacts to external contact areas on the underside of the rewiring substrate.

The bonding contact pads on the top side of the rewiring substrate are connected via bonding wires to corresponding contact areas on the active top side of the semiconductor chip. Consequently, the external contacts of the semiconductor component have an electrical connection to the contact areas of the semiconductor chip and thus to the electrodes of the integrated circuit. This arrangement has the advantage that, via external contacts, both control signals and supply signals can be fed to the semi-conductor chip with the main coupling element of the semiconductor component.

Relative to the semiconductor component, the sensor component is constructed with a lower outlay and fewer components. The sensor component with its sensor coupling element embedded in a plastic housing composition does not require a rewiring substrate with external contacts, since both the supply of energy and the data transmission are effected via the sensor coupling element. External contacts and also a complex rewiring substrate are thus obviated. Rather, a rewiring, if necessary, may be provided directly on the active top side of the sensor chip without increasing the production costs, since it is possible to apply such a rewiring with the last metal structure on the semiconductor chip.

Consequently, the invention encompasses a sensor component having a sensor chip, the sensor chip being partly encapsulated by a plastic housing composition. Arranged in the region of the plastic housing composition is a sensor coupling element for wireless transmission. For this purpose, the sensor coupling element is electrically connected to a sensor region arranged on its active top side. The sensor coupling element enables a wireless energy transmission to the sensor chip and provides a wireless data transmission for the sensor chip.

A sensor component of this type has the advantage that it is constructed from only three main components, namely the plastic housing composition in which merely a sensor coupling element and a sensor chip are embedded. The production costs are thus clear and low, especially as neither a rewiring substrate nor external contacts on the rewiring substrate need to be provided for the sensor component. In principle, the sensor component may be destroyed for hygienic reasons after an analysis of a medical sample and thus after a single use, without incurring substantial cost from the destruction. For bacteriological and virological examinations, the sensor component thus has considerable advantages over other known analysis instruments and analysis units.

Furthermore, the plastic housing composition may have a sensor opening for application of samples to a sensor region of the sensor chip. The sensor chip itself may be produced not only from semiconductor material but also from transparent glass, transparent plastic or transparent ceramic material. These materials may have, in addition to a rewiring coating, a sensitive coating in the sensor region, with the aid of which the electrical resistance of the sample, chromatographic changes in the sample or other parameters of the sample arranged in the sensor opening are detected.

Where the underside of the sensor chip has an optically transmitting region, it is possible to cover the sensor region of the sensor chip with a medical or biological material, such as blood. Via the optically transparent sensor chip and the aperture on the underside of the sensor component, chromatographic properties of the sample can be transmitted onto the optically sensitive region of the semiconductor component in order to evaluate the optical signals there. Other parameters such as resistance and/or impedance values may simultaneously be transmitted in wireless manner to the main coupling element via the sensor coupling element.

The sensor coupling element can be embedded in the plastic housing composition that surrounds the sensor opening in the plastic housing composition of the sensor component. This advantageously has the effect that the medical sample to be applied is locally delimited by the plastic housing composition and is held in the sensor opening.

In the above described stack arrangement, the main coupling element supplies the sensor chip of the sensor component with energy via the sensor coupling element of the sensor component. A stack of this type has the advantage that the sensor component with its coupling element comes into the local region of the coupling element of the semiconductor component, thereby enabling a direct, low-loss energy transmission. An efficiency of between 1% and 5% is expected in the case of such a wireless energy transmission, while the pure signal data transmission may proceed independently thereof. Moreover, the sensor chip of a sensor stack with its sensor coupling elements may be made sufficiently small to arrange a plurality of sensor components next to one another on the semiconductor component and above the main coupling element. In this case, the signal transmissions may be carried out in a multiplex operation for each of the sensor components to be tested, while the energy supply proceeds uniformly for all of the sensor components via a corresponding near-field coupling.

When the aforementioned adhesive layer, or an adhesive gel and/or a double-sided adhesive film is arranged between the sensor component and the semiconductor component, the adhesive or gel does not cure, so that the sensor components can be removed again from the semiconductor component without excessive action of force. The adhesive, film and/or gel used are in this case optically transparent in order to enable an optical transmission of data.

Where the sensor component is positioned by a mechanical device, such as a conveyor belt or a rotary table, above the semiconductor component in such a way that a signal transmission is possible optically or electromagnetically, automation of analysis is facilitated, especially since manual removal of the sensor component is obviated. This mechanical device is then configured such that the sensor components and their samples are positioned above the semiconductor component and analyzed either in a stepwise manner or continuously.

A method for testing a biochemical sample with the aid of a sensor component according to the invention and a semiconductor component that supplies the sensor component with energy includes the following steps. Firstly, a biochemical sample is applied to a sensor component. The sensor component with the sample is then placed onto a semiconductor component. The wireless energy transmission from the semiconductor component to the sensor component is subsequently effected. At the same time or with a temporal offset, a wireless signal transmission from the sensor component to the semiconductor component may be effected via the coupling elements of the two components there lying one on the other or stacked one on the other. In addition or as an alternative, it is possible to effect an optical coupling between the sensor region of the sensor component and an optically sensitive region of a semiconductor chip of the semiconductor component that is free of a plastic housing composition.

This method has the advantage that a respective sensor component can be used for different biochemical samples, which sensor component is subsequently destroyed as a disposal product. For this purpose, as mentioned above, the sensor component has merely three components, namely a sensor chip, a coupling element coupled thereto for wireless transmission, and a housing composition that partly embeds the sensor chip and completely embeds the coupling element. Further, the method has the advantage that the placement of the sensor component with a sample onto the semiconductor component can be effected relatively non-critically, since the coupling elements do not have to be exactly opposite one another for the wireless transmission. Rather, it suffices for the sensor component with its coupling element to be brought into the local region of the coupling element of the semiconductor component in order to ensure both the energy transmission and the signal transmission.

An implementation of the method may furthermore have the following steps. Firstly, the semiconductor component calls up sensor data from the sensor component via its main coupling element, whereupon the sensor component supplies, via the sensor coupling element, sensor results to the semiconductor component via the main coupling element thereof for evaluation and storage. This method has the advantage that the mode of operation of sensor component and semiconductor component depends only on the coupling effect of the two coupling elements. An optical transmission is not provided in this implementation of the method.

A further implementation of the method provides for the semiconductor component to call up sensor data via the main coupling element and for the sensor component thereupon to supply sensor results optically to the semiconductor component for evaluation and storage. In this exemplary implementation of the method, a transmission of the signals is carried out only in one direction, namely from the semiconductor component via the main coupling element to the sensor coupling element, but not in the opposite direction from the sensor coupling element to the main coupling element. Rather, the second possibility of the sensor stack, in the case of which the optical transmission path is used, is utilized. This optical transmission path from the sensor component to the semiconductor component has the advantage that the optical transmission path is insensitive to electromagnetic interference fields.

Furthermore, provision is made for arranging and testing a plurality of biochemical samples simultaneously on a semiconductor component. Given a design with a sufficiently large area, a plurality of sensor components with smaller coupling elements than the main coupling element may be arranged in the region of the coupling element of the semiconductor component. This has the advantage that mass examinations become possible in a cost-effective manner.

Furthermore, the method according to the invention provides for measurement results and/or evaluation results to be forwarded from the integrated circuit of the semiconductor component to a superordinate circuit via external contacts of the semiconductor component. This concept makes it possible for a plurality of semiconductor components to be arranged on the superordinate circuit board, so that the throughput of measurements of biochemical samples can be increased further. It is possible to populate entire trays with semiconductor components, with the semiconductor components having a plurality of sensor components stacked thereon one next to the other.

The invention affords the possibility of multiple sensor applications without direct electrical contact between sensor component and semiconductor component, which may have a logic chip. A further advantage is the single application in multiple biological tests by means of the semiconductor sensors. Finally, the invention provides the advantage of avoiding electrical connections for the sensor stack, so that, merely after each sample detection and sample measurement, only the sensor component has to be discarded after simply being removed, pushed down or sucked away from the semiconductor component.

Advantageously, the electrical connection is not produced by fixed wire connections or soldering contact connections, but rather by transmission of the sensor signal at a defined frequency by, for example, an inductive pulse that is transmitted via a coil. In a specific embodiment of the invention, the signal transmission per se may be effected by an optical pulse from the sensor chip via an optically transmissive substance onto a corresponding optically sensitive region of the logic chip of the semiconductor component or by means of piezotechnology through a change in pressure at the logic chip of the semiconductor component.

Moreover, the invention has the advantage that, by integrating a capacitor unit on the sensor chip, the latter can be charged for an optical or electrical pulse by the coupling element in the form of an induction coil. As a result, plural applications of the sensors can be achieved without the direct electrical supply thereof.

If fixing becomes necessary during the production of a sensor stack, the sensor component can be implemented on the semiconductor component by an optically transmissive double-sided adhesive film using a paste or a corresponding gel. By shifting the sensor component on the semiconductor component, the corresponding coupling position can be shifted using a gel layer. If the sensor component is connected to the semiconductor component to form a sensor stack by such layers comprising paste, gel or comprising a double-sided adhesive film, then the sensor components can be exchanged by pulling the used sensor components off the respective adhesive layer and a new sensor component can be fixed by lightly pressing it onto the adhesive layer again. Such a rapid change cannot be effected in the case where the sensor component is fixedly electrically connected to the semiconductor component.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention covered within the scope of the appended claims and their equivalents.

LIST OF REFERENCE SYMBOLS

1 Semiconductor component
2 Semiconductor chip
3 Substrate
4 Plastic housing composition for semiconductor component
5 Region of the plastic housing composition
6 Main coupling element
7 Active top side of the semiconductor chip
8 External contacts of the semiconductor component
9 Main coupling coil
10 Optically transparent opening
11 Optically sensitive region of the semiconductor chip
12 Rewiring substrate
13 Underside of the rewiring substrate
14 Bonding contact pads
15 Bonding wires
16 Sensor chip
17 Sensor region
18 Top side of the sensor chip
19 Underside of the sensor chip
20 Sensor component
21 Sensor stack
22 First stack component
23 Second stack component
24 Sensor coupling element
25 Sensor coupling coil 26 Sensor opening
27 Sensor optical system opening
28 Plastic housing composition of the sensor component
29 Optically transmitting region of the sensor component
30 Top side of the rewiring substrate
31 Contact areas on semiconductor chips
32 Double-sided adhesive film
33 Contact pins
34 Edge region of the sensor chip
35 Conveyor belt
36 Gripping arm
37 External contour
38 Opening in the gripping arm

We claim:

1. A semiconductor component, comprising:
a substrate;
a semiconductor chip arranged on the substrate;
a plastic housing composition at least partially covering the substrate and the semiconductor chip;
a main coupling element for wireless transmission arranged in a region of the plastic housing composition;
an integrated circuit arranged on an active top side of the semiconductor chip and electrically connected to the main coupling element, wherein the active top side of the semiconductor chip includes an optically sensitive region arranged below an optically transparent opening in the plastic housing composition; and
external contacts electrically connected to the integrated circuit with the main coupling element.

2. The semiconductor component as claimed in claim 1, wherein the main coupling element comprises a main coupling coil.

3. The semiconductor component as claimed in claim 1, wherein the main coupling element surrounds the optically transparent opening in the plastic housing composition.

4. A semiconductor component, comprising:
a rewiring substrate having a top side and an underside;
a semiconductor chip arranged on the substrate;
a plastic housing composition at least partially covering the substrate and the semiconductor chip;
a main coupling element for wireless transmission arranged in a region of the plastic housing composition;
an integrated circuit arranged on an active top side of the semiconductor chip and electrically connected to the main coupling element; and
external contacts electrically connected to the integrated circuit with the main coupling element, the underside of the rewiring substrate being coupled to the external contacts, the rewiring substrate being covered partly by the semiconductor chip and partly by the plastic housing composition on the top side, the rewiring substrate comprising, on the top side, bonding contact pads surrounding the semiconductor chip, which are connected via the rewiring substrate to the external contacts and via bonding contact pads on the active top side of the semiconductor chip.

5. A sensor component, comprising:
a sensor chip;
a plastic housing composition partially encapsulating the sensor chip;
a sensor coupling element for wireless transmission arranged in a region of the plastic housing composition; and
a sensor region arranged on an active top side of the sensor chip and electrically connected to the sensor coupling element, wherein the sensor coupling element provides a wireless energy transmission to the sensor chip and a wireless data transmission for the sensor chip, wherein the plastic housing composition comprises a sensor opening for application of samples to the sensor region of the sensor chip.

6. The sensor component as claimed in claim 5, wherein the sensor coupling element comprises a sensor coupling coil.

7. The sensor component as claimed in claim 6, wherein the sensor coupling element surrounds the sensor opening in the plastic housing composition of the sensor component.

8. The A sensor component, comprising:
a sensor chip;
a plastic housing composition partially encapsulating the sensor chip, wherein an underside of the sensor chip includes an optically transmitting region arranged in a sensor optical system opening of the plastic housing composition on the underside of the sensor chip;
a sensor coupling element for wireless transmission arranged in a region of the plastic housing composition; and
a sensor region arranged on an active top side of the sensor chip and electrically connected to the sensor coupling element, wherein the sensor coupling element provides a wireless energy transmission to the sensor chip and a wireless data transmission for the sensor chip.

9. A sensor stack, comprising:
semiconductor component comprising: a substrate; a semiconductor chip arranged on the substrate; a plastic housing composition at least partially covering the substrate and the semiconductor chip; a main coupling element for wireless transmission arranged in a region of the plastic housing composition; an integrated circuit arranged on an active top side of the semiconductor chip and electrically connected to the main coupling element; and external contacts electrically connected to the integrated circuit with the main coupling element; and
a sensor component comprising: a sensor chip; a plastic housing composition partially encapsulating the sensor chip; a sensor coupling element for wireless transmission arranged in a region of the plastic housing composition; and a sensor region arranged on an active top side of the sensor chip and electrically connected to the sensor coupling element, wherein the sensor coupling element provides a wireless energy transmission to the sensor chip and a wireless data transmission for the sensor chip;
wherein the sensor component is stacked on the semiconductor component and the sensor component and semiconductor components are wirelessly coupled via the main coupling element and the sensor coupling element, the main coupling element supplying the sensor chip with energy via the sensor coupling element.

10. The sensor stack as claimed in claim 9, wherein a plurality of sensor components with sensor chip and sensor coupling element are arranged next to one another on the semiconductor component above the main coupling element.

* * * * *

UNITED STATES PATENT AND TRADEMARK OFFICE
CERTIFICATE OF CORRECTION

PATENT NO. : 7,230,309 B2 Page 1 of 1
APPLICATION NO. : 10/956087
DATED : June 12, 2007
INVENTOR(S) : Michael Bauer et al.

It is certified that error appears in the above-identified patent and that said Letters Patent is hereby corrected as shown below:

Col. 18, line 13: delete "The".

Signed and Sealed this

Fourth Day of December, 2007

JON W. DUDAS
*Director of the United States Patent and Trademark Office*